United States Patent [19]

Mannonen

[11] Patent Number: 5,331,321
[45] Date of Patent: Jul. 19, 1994

[54] A/D CONVERTER AND D/A CONVERTER EMPLOYING A RODIX SMALLER THAN A TWO, AND CALIBRATION THEREOF

[75] Inventor: Pentti Mannonen, Vantaa, Finland

[73] Assignee: Nokia Mobile Phones, Ltd., Salo, Finland

[21] Appl. No.: 965,405

[22] PCT Filed: Jul. 2, 1991

[86] PCT No.: PCT/FI91/00209
§ 371 Date: Mar. 1, 1993
§ 102(e) Date: Mar. 1, 1993

[87] PCT Pub. No.: WO92/00630
PCT Pub. Date: Jan. 9, 1992

[30] Foreign Application Priority Data

Jul. 2, 1990 [FI] Finland .................. 903334

[51] Int. Cl.$^5$ ............................................. H30M 1/00
[52] U.S. Cl. ................................. 341/110; 341/120; 341/126
[58] Field of Search ............... 341/110, 126, 144, 155, 341/118, 120

[56] References Cited

U.S. PATENT DOCUMENTS

| | | | |
|---|---|---|---|
| 3,216,001 | 11/1965 | Hinrichs | 341/127 |
| 4,336,526 | 6/1982 | Weir | 341/165 |
| 4,903,023 | 2/1990 | Evans et al. | 341/120 |
| 4,962,380 | 10/1990 | Meadows | 341/120 |
| 5,164,726 | 11/1992 | Bernstein et al. | 341/120 |

FOREIGN PATENT DOCUMENTS 903334  4/1991  Finland .

OTHER PUBLICATIONS

Digital Circuits and Devices, Teuvo Kohonen, Prentice-Hall Inc., 1979, pp. 13 and 14.

Primary Examiner—Marc S. Hoff
Attorney, Agent, or Firm—Perman & Green

[57] ABSTRACT

A converter system is comprised of an analog-to-digital converter (1) and a digital-to-analog converter (2). A first base number of a number system used in the analog-to-digital converter is less than 2, and a second base number of a number system used int he digital-to-analog converter is less than two. The first base number does not equal the second base number. For example, both are within a range from 1.90 to 1.99. In a calibration method the output of the digital-to-analog converter is switched to the input of the analog-to-digital converter, and a controller (3) provides digital values to the input of the digital-to-analog converter ,and receives corresponding digital values from the output of the analog-to-digital converter.

14 Claims, 1 Drawing Sheet

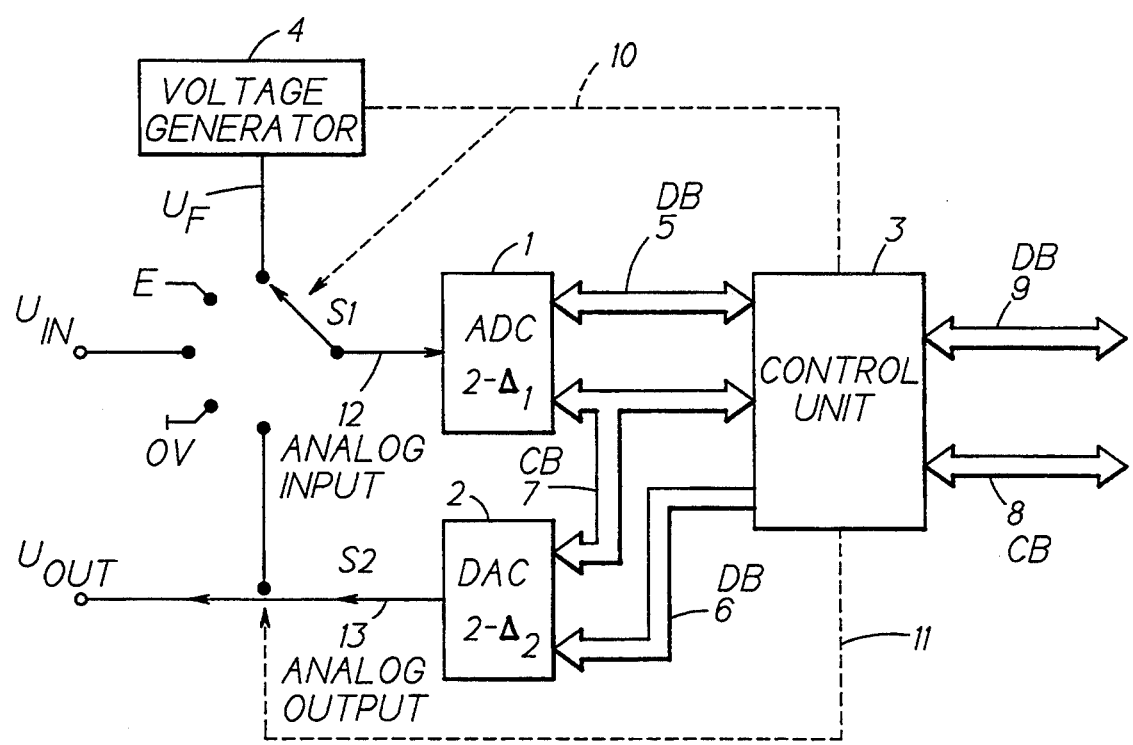

A/D CONVERTER AND D/A CONVERTER EMPLOYING A RODIX SMALLER THAN A TWO, AND CALIBRATION THEREOF

FIELD OF THE INVENTION

The present invention relates to A/D and D/A converters and converter systems and their calibration methods.

BACKGROUND OF THE INVENTION

Digital-to-analog (D/A) and analog-to-digital (A/D) converters are used generally in electronics, especially in computer interfaces, to convert an analog signal into digital form, and vice versa. In rapid and accurate converters, it is customary to use a binary weight system in which the base number is 2:

$$U = (C + B_1 2^{-1} + B_2 2^{-2} + \ldots + B_n 2^{+n})E, \tag{1}$$

where U is the value of an analog signal, E is a reference voltage used in the converter, and $B_1 \ldots B_n$ are binary values (0,1) C is a constant and n is the number of the bits/weights of the converter.

The binary weights $2^{-k}$ of the converters are usually realized by weight or reference elements forming a so-called weighing network. In practice, the weighing network and the weight elements are usually realized by means of resistors, capacitors and transistors. The accuracy of the converter thereby depends on how accurately the relationship between the values of the weight elements is the right one. This involves very high requirements for the converter manufacturing technique, and in many cases converters have to be tuned after manufacture. Further, as the values of the weight elements vary in time (drifting), the accuracy limit of converters is usually about 12 bits. Converters having a greater accuracy than that have to be calibrated or tuned intermittently during use.

Converters usually have to be calibrated by adjusting the values of the weight elements and the reference voltages.

In addition, when great speed and accuracy are to be achieved, the time required for the converter to settle to the required accuracy causes problems. For this reason, the most accurate conventional converters are usually also slow.

SUMMARY OF THE INVENTION

The object of the present invention is to provide a novel A/D or D/A converter which is more accurate, easier to calibrate and less demanding in view of the manufacturing technique than previously.

This is achieved by means of an A/D or D/A converter which according to the invention is characterized in that the base number of the number system used in the converter is smaller than 2.

The invention is based on the Applicant's discovery that when a number system having a base number smaller than 2 is used in the converter in place of the binary system, the obtained converter comprises number ranges in which the same number is formed by different combinations of bits. Consequently, deviation can be allowed for the weights without the risk of gaps remaining in the number range of the converter. The actual accurate value of the weight can be determined by calculation or programmatically with a certain self-calibration procedure and each conversion result can be corrected on the basis of these actual weights. For example, the offset and noise of the comparators of a weighing A/D converter do not cause an error in the conversion, as the same voltage value can be represented at the threshold value points of the comparators with two different bit series in the number system according to the invention. In a normal binary system, inaccuracy in the weights causes a gap in the number range of the converter, and the error caused by the gap is impossible to correct.

By means of the invention, the weights and other parameters of the converter, such as resistor and capacitor values, comparator offset, gain, rising time, etc., can be allowed to deviate fairly largely within certain limits. The structure of the converter is simple, requiring no greater accuracy from the manufacturing technique, which, in turn, reduces costs.

The speed of the A/D converter can be increased as the sampling frequency is constant and thus the amplifier need not reach its final state before conversion, because such settling time errors will be compensated for in calibration.

Converters can be calibrated (the weight values can be measured) by software at desired moments. Subsequent errors occurring in conversions are caused by noise and interferences only. The bit number of the converter can be increased up to the noise limit. Using certain methods, values below the noise limit can be obtained in calibration.

The invention is also concerned with a method for calibrating the A/D converter of the invention.

The invention further relates to an A/D and D/A system comprising an A/D and D/A converter of the invention, and with a method for calibrating the A/D and D/A converter system.

BRIEF DESCRIPTION OF THE DRAWING

The invention will now be described in more detail with reference to the attached drawing, wherein the sole FIGURE shows a block diagram of an A/D and D/A converter system according to the invention.

DETAILED DESCRIPTION OF THE INVENTION

The converters according to the invention, the input voltage U of the A/D converter or the output voltage of the D/A converter fulfills the following equation:

$$U = (B_1 x_1 + B_2 x_2 + \ldots + B_n n + C)E, \tag{2}$$

where $X_1 \ldots x_n$ are the weight values of the converter, $B_1 \ldots B_n$ are bits having a value 0 or 1, and C is a constant containing the offset values of the converter.

In order that the number range of the converter would be continuous throughout, the following condition has to be set for the weights $x_k$ of the converter:

$$\sum_{p=k+1}^{n} X_p \geq X_k - X_n, \, k = 0, \ldots, n-1 \tag{3}$$

Equation (4) sets a condition that the sum of weight values preceding each weight has to be greater than the value of this particular weight.

$$X_p = \frac{1}{2 - \Delta_p} X_{p-1}; \, \Delta_p \geq 0 \tag{4}$$

According to the invention, this condition is fulfilled by using, in place of the binary number system with the base number 2, another number system in which the base number is smaller than 2, whereby Equation (2) will be:

$$U = [C + B_1(2-\Delta)^{-1} + B_2(2-\Delta)^{-2} \ldots + B_n(2-\Delta)^n]E \quad (5)$$

where $(2-\Delta)$ is the base number of the number system, in which $\Delta$ is preferably in the range from 0.01 to 0.1. The base number of the number system is correspondingly in the range from 1.90 to 1.99. From now on, the number system according to the invention will be referred to as a $(2-\Delta)$ system. The number $\Delta$ may also slightly vary in one and the same converter from one weight to another.

The FIGURE shows a block diagram of a specific converter system according to the invention. The system comprises an analog-to-digital converter 1 (ADC) utilizing a $(2-\Delta_1)$ system. The system further comprises a D/A converter 2 (DAC) utilizing a $(2-\Delta_2)$ system. The numbers $\Delta_1$ and $\Delta_2$ are different, as a result of which the base numbers of the number systems of the converters 1 and 2 are different, as calibration by a method to be described later could not be carried out if the base numbers would be equal. The base number $(2-\Delta_1)$ of the converter 1 and the base number $(2-\Delta_2)$ of the converter 2 may vary within the respective converter from one weight to another within a predetermined tolerance area, but the mean values of the base numbers of the two converters have to differ from each other.

The converters 1 and 2 are connected to a control unit 3, preferably a computer, controlling them through data buses DB 5 and 6 and a common control bus CB 7. In the preferred embodiment of the invention, data to be transferred over the data bus 5 is in the number system $(2-\Delta_1)$, and data to be transferred over the data bus 6 is in the number system $(2-\Delta_2)$. The control unit 3 is also connected to external systems through a control bus CB 9 and a binary data DB bus 8.

An analog input 12 in the A/D converter 1 is connectable by a change-over switch S1 to an analog input voltage $U_{IN}$, to a reference voltage E corresponding to the largest value of the number range of the converter, to another reference value (e.g. 0 V) corresponding to the zero value of the number range of the converter, to the output of a voltage generator 4 or to an analog output 13 in the D/A converter 2. The analog output 13 of the D/A converter 2 is connectable by means of a change-over switch S2 to an analog output $U_{OUT}$ of the converter system or to the analog input 12 of the A/D converter 1. The control unit 3 controls the operation of the switches S1 and S2 and the voltage generator 4, as is illustrated by broken lines 10 and 11.

The converter system of the invention calibrates itself automatically by means of software. In normal use, the analog input of the A/D converter 1 is connected to the analog input $U_{IN}$ of the system and correspondingly the analog output 13 of the D/A converter 2 is connected to the analog output $U_{OUT}$ of the system. The A/D converter 1 performs an analog-to-digital conversion and applies the digital numbers in the $(2-\Delta_1)$ system over the data bus 5 to the control unit 3, which corrects the conversion results by means of calibration parameters calculated in accordance with a predetermined calibration procedure and converts the corrected results into the binary system. Correspondingly, the control unit 3 corrects control words to the D/A converter 2 by means of calibration parameters calculated for this converter and applies the control words over the data bus 6 to the converter 2. In other words, in the present invention, the inaccurate values of the weights of the converters 1 and 2 are accurately known, and each conversion result from the A/D converter 1 is corrected automatically and correspondingly each control word to the D/A converter 2 is corrected in such a way that an analog voltage obtained as a result of the conversion is accurately correct.

Alternatively, the control unit 3 may contain a search-table type memory to which a corrected value corresponding to the bit pattern supplied by the A/D converter 1 has been stored at the calibration stage. Correspondingly, the control unit 3 may contain another search table in which a corrected control word to be fed to the D/A converter 2 is stored for each control word intended for the converter 2. These search tables may also perform conversions into the binary system and vice versa. The operations of the control unit 3 may also be partly or wholly integrated in the converters 1 and 2.

In the following the calibration of the A/D converter 1 will be described- The input voltage $U_{IN}$ of the converter is obtained from the following equation:

$$U_{IN}/E = C_1 + \sum_{k=1}^{n1} B_k X_k \quad (6)$$

$C_1$ is a constant containing the offset voltages of the converter 1. The A/D converter 1 may be calibrated in several ways by means of the reference voltages E and 0 V and the voltage generator 4 and the D/A converter 2.

1. Calibration by the Reference Voltages 0 V and E

When the A/D converter 1 is a cyclic 1-bit converter, it can be calibrated by connecting the input 13 alternately to the reference voltages 0 V and E, and so the following equation group can be obtained from Equation (6)

$$1 = C1 + \sum_{k=1}^{n1} B_{1k} X_k \quad (7)$$

$$0 = C1 + \sum_{k=1}^{n1} B_{0k} X_k \quad (8)$$

where $X_k = X^k$. From Equations (7) and (8), C1 and $X_k$ used as calibration parameters are solved. When the weights $x_k$ of the converter 1 are accurately known, the input voltage $U_{IN}$ can be calculated from bits supplied by the converter 1 by means of Equation (6).

2. Calibration by the Voltage Generator 4

The basic idea of this calibration method is that the weights $X_k$ of the A/D converter 1 can be measured by using the calibration generator 4 having an output voltage $U_f$ varying with time according to a known function, which can also be measured. Generally, the function $U_f$ is $$U_f = E f(n, \alpha),$$

where $n = 0, 1, 2, \ldots$, max; $\alpha$ = a parameter vector = $(\alpha_1, \alpha_2, \ldots \alpha_p)$. In practice, the function $U_f$ may be e.g.

$$U_f = E(1 - \alpha_1 n + \alpha_2 n^2 + \alpha_3 n^3). \qquad (10)$$

By connecting the input of the converter 1 alternately to both the reference voltage 0 V and the calibration generator 4 and storing the measuring results, an equation group will be obtained $$f(n,\alpha) = \sum_{k=1}^{n1} B_{nk} X_k + C \qquad (11)$$

$$0 = \sum_{k=1}^{n1} D_k X_k \qquad (12)$$

where $n = 0, 1, \ldots, \max$; $D_k = \{0,1\}$; $B_k = \{0,1\}$.

From this equation group, C, X and $\alpha$ can be solved. The number (max) of the input voltages has to be greater than the number $n_1$ of the weights $x_k$. None of the bits from the output of the converter 1 may remain unchanged during calibration, which is ensured by a great number of input voltages. In addition, noise can be partly compensated for by a great number of equations.

3. Calibration by the D/A Converter 2

In this method the D/A converter 2 is used in place of the calibration generator 4. The output voltage $U_{OUT}$ of the D/A converter 2 is obtained in the following way:

$$U_{OUT}/E = \sum_{k=1}^{n2} D_{nk} Y_k + C_2 \qquad (13)$$

where $D_k$ = the control bit of the converter 2 = 1 or 0; $Y_k$ = the weight of the converter 2 =

$$\frac{1}{2 - \Delta_k} Y_{k-1};$$

$C_2$ = constant.

The input of the A/D converter 1 is first connected to the reference voltages E and 0 V and then to the output 13 of the D/A converter 2. The control unit 3 applies several numbers to the converter 2, which numbers are subjected to D/A conversion by the converter 2 and then to A/D conversion by the converter 1. The obtained measuring results are stored. The numbers to be applied to the converter 2 may be predetermined or alternately generated at random. By measuring, the following equation group is obtained $$1 = C1 + \sum_{k=1}^{n1} B_{1k} X_k \qquad (14)$$

$$0 = C1 + \sum_{k=1}^{n1} B_{0k} X_k \qquad (15)$$

$$C2 = C1 + \sum_{k=1}^{n1} B_{2k} X_k \qquad (16)$$

$$C2 + \sum_{k=1}^{n2} D_{jk} Y_k = C1 + \sum_{k=1}^{n1} B_{jk} X_k \qquad (17)$$

where $j = 3, 4, 5, \ldots, \max$. From the equation group, C1, C2, $Y_k$ and $x_k$ are solved by means of the measuring results. The D/A converter 2 may also be calibrated separately through the A/D converter 1 when the converter 1 has first been calibrated by the method 1 or 2. When the weights $y_k$ of the D/A converter 2 are accurately known, control bits $D_k$ from the converter 2, corresponding to a predetermined output voltage $U_{OUT}$, can be calculated from Equation (13) in the control unit 3.

Each conversion to be carried out by the converters 1 and 2 thus requires that the control unit 3 performs a calculation according to Equation (6) or (13). The load of the control unit 3 (e.g. a computer) can be reduced by providing the converters 1 and 2 with a correcting memory and a calculation circuit solving the equations in question. The control unit 3 thereby still performs the calibration, but stores the calculated calibration parameters in the correcting memories of the converters.

Alternatively, differences between the assumed and actual values of the weights of the converter can be determined by calibration, and these differences are used as calibration parameters when correcting the conversion results.

As the calibration methods 2 and 3 are computationally very heavy, they are basic calibrations to be performed relatively seldom. Since the relationships between the component values of the converter vary with time relatively slowly, the more rapid offsets caused e.g. by drifting or temperature variation and having a similar effect on all weights of the converter, can be calibrated more often with rapid (about 1,000 times more rapid) and computationally light intermediate calibration methods.

In one intermediate calibration system, the analog input 12 of the A/D converter 1 is connected in succession to the above-mentioned reference voltages E and 0 V. When the offset correction required for the weights is denoted with the calibration parameter Z, the following equation group is obtained on the basis of measurements $$1 = C1 = + Z \sum_{k=1}^{n1} B_{1k} X_k; U_{IN} = E \qquad (18)$$

$$0 = C1 = + Z \sum_{k=1}^{n1} B_{0k} X_k; U_{IN} = 0 \qquad (19)$$

Herein $X_k$ are the same as the previously calibrated values. From the equations, Cl and Z are solved. Thereafter the values $X_k$ are corrected with the additional parameter Z now calculated in the following way: $X_k = Z X_k$.

Thereafter the D/A converter 2 can be subjected to a corresponding rapid calibration by controlling it so as to cause it to form alternately a low ($D_k = 0$) and a high voltage in its output 13 and measuring the voltages by the A/D converter 1.

The above equations are valid in cases where the non-linearities of the circuits can be disregarded. When the non-linearities are taken into account, the equations and the calculation become somewhat more complicated without however deviating from the basic idea of the invention.

The attached FIGURE and the description related to it are only intended to illustrate the present invention. In their details, the converter, converter system and calibration methods of the invention may vary according to the attached claims.

I claim:

1. A converter system comprising an analog-to-digital converter and a digital-to-analog converter, characterized in that a first base number of a number system used in the analog-to-digital converter is less than 2, further characterized in that a second base number of a number system used in the digital-to-analog converter is less than two, and wherein the first base number does not equal the second base number.

2. Converter according to claim 1, characterized in that said first base number equals $2-\Delta_1$, wherein said second base number equals $2-\Delta_2$, and where $\Delta_1$ and $\Delta_2$ are preferably within the range from 0.01 to 0.1.

3. A converter according to claim 2, characterized in that the converter comprises correcting means for correcting conversion results of the analog-to-digital converter in the $2-\Delta$ base number system of the converter or for providing calibration parameters calculated by means of a predetermined calibration procedure.

4. A converter according to claim 2, characterized in that the analog-to-digital converter comprises means for converting conversion results, which are in the $2-\Delta$ base number system, into a binary number system.

5. A converter according to claim 2, characterized in that the converter comprises correcting means for correcting digital numbers which are to be converted by the digital-to-analog converter or for replacing digital numbers before conversion with calibration parameters calculated by means of a predetermined calibration procedure.

6. Converter according to claim 1, characterized in that the converter further comprises correcting means for correcting conversion results of the analog-to-digital converter in the first base number system of the converter or for providing calibration parameters calculated by means of a predetermined first calibration procedure, said correcting means further correcting digital numbers of the second base number system which are to be converted by the digital-to-analog converter or for replacing digital numbers before conversion with calibration parameters calculated by means of a predetermined second calibration procedure.

7. A method of calibrating an analog-to-digital converter, characterized in that the method comprises the steps of:
providing a converter system having an analog-to-digital digital converter and a digital-to-analog converter, wherein a first base number of a number system used in the analog-to-digital converter is less than 2, wherein a second base number of a number system used in the digital-to-analog converter is less than two, and wherein the first base number does not equal the second base number;
connecting an along input of the analog-to-digital converter alternately to a reference voltage corresponding to a zero value of a number range of the analog-to-digital converter and to a reference voltage corresponding to a largest value of the number range;
storing conversion results output by the analog-to-digital converter; and
calculating actual values or calibration values of weights of the analog-to-digital converter on the basis of the known reference voltage values and the stored conversion results corresponding to the known reference voltage values.

8. A method according to claim 7, characterized in that the method calculates differences between assumed and actual values of weights of the analog-to-digital converter, the differences being used as calibration parameters in the correction of the conversion results.

9. A method of calibrating an analog-to-digital converter, characterized in that the method comprises the steps of:
providing a converter system having an analog-to-digital converter and a digital-to-analog converter, wherein a first base number of a number system used in the analog-to-digital converter is less than 2, wherein a second base number of a number system used in the digital-to-analog converter is less than two and wherein the first base number does not equal the second base number;
connecting an analog input of the analog-to-digital converter to a voltage source supplying a voltage varying with time according to a known function covering an output number range of the analog-to-digital converter;
connecting the analog input to a reference voltage corresponding to a zero value of the number range of the analog-to-digital converter;
storing conversion results output by the analog-to-digital converter in response to both said known voltage source and said reference voltage; and
calculating actual values or calibration values of weights of the analog-to-digital converter on the basis of said known voltage function, the reference voltage, and the stored conversion results corresponding to said known voltage function and the reference voltage.

10. A method according to claim 9, characterized in that the method calculates differences between assumed and actual values of weights of the analog-to-digital converter, the difference being used as calibration parameters in the correction of the conversion results.

11. A method of calibrating a converter system, characterized in that the method comprises the steps of:
providing a converter system comprising an A/D converter and a D/A converter having analog sides connectable to each other for the calibration of at least the D/A converter, wherein the base numbers of the number systems used in the A/D converter and the D/A converter are mutually different and smaller than 2;
connecting an analog input of the A/D converter alternately to a reference voltage corresponding to a zero value of a number range of the A/D converter, to a reference voltage corresponding to a largest value of the number range of the A/D converter, and to an analog output of the D/A converter;
applying digital control values to the D/A converter when connected to the A/D converter;
storing conversion results output from the A/D converter; and
calculating actual values or calibration values of weights of the A/D and D/A converters when both converters are uncalibrated, or calculating the actual values or calibration vales of the weights of only the D/A converter when the A/D converter is calibrated in advance, on the basis of the known reference voltage values, the stored conversion results and the control values of the D/A converter.

12. A method according to claim 11 characterized in that the control values of the D/A converter are predetermined control values or are control values that are generated at random.

13. A/D and D/A converter system comprising an A/D converter (1) and a D/A converter (2) having analog sides (12, 13) connectable to each other for the calibration of at least the D/A converter, characterized in that the base numbers of the number systems used in the converters (1, 2) are mutually different and smaller than 2.

14. Converter system according to claim 13, characterized in that the base number of the number system of the A/D converter (1) may vary within a first tolerance area and the base number of the number system of the D/A converter (2) may vary within a second tolerance area in such a way that the mean values of the base numbers of the converters are different.

* * * * *